(12) United States Patent
Ju et al.

(10) Patent No.: US 10,535,935 B2
(45) Date of Patent: Jan. 14, 2020

(54) ELECTRICAL CONNECTOR HAVING SUPPORTING PORTIONS AND INSULATING BODY INTEGRALLY FORMED

(71) Applicant: LOTES CO., LTD., Keelung (TW)

(72) Inventors: Ted Ju, Keelung (TW); Zhi Yong Zhou, Keelung (TW)

(73) Assignee: LOTES CO., LTD, Keelung (TW)

( * ) Notice: Subject to any disclaimer, the term of this patent is extended or adjusted under 35 U.S.C. 154(b) by 0 days.

(21) Appl. No.: 16/205,446

(22) Filed: Nov. 30, 2018

(65) Prior Publication Data

US 2019/0173207 A1   Jun. 6, 2019

(30) Foreign Application Priority Data

Dec. 1, 2017 (CN) .......................... 2017 1 1250191
Dec. 25, 2017 (CN) .......................... 2017 1 1419161

(51) Int. Cl.
| | |
|---|---|
| *H01R 12/71* | (2011.01) |
| *H01R 13/46* | (2006.01) |
| *H01R 13/40* | (2006.01) |
| *H05K 7/10* | (2006.01) |
| *H01R 12/70* | (2011.01) |
| *H01R 13/24* | (2006.01) |

(52) U.S. Cl.
CPC ....... *H01R 12/712* (2013.01); *H01R 12/7076* (2013.01); *H01R 12/714* (2013.01); *H01R 12/716* (2013.01); *H01R 13/40* (2013.01); *H01R 13/46* (2013.01); *H05K 7/1069* (2013.01); *H01R 12/707* (2013.01); *H01R 13/2464* (2013.01)

(58) Field of Classification Search
CPC .. H01R 12/712; H01R 12/714; H01R 12/716; H01R 12/7076; H01R 12/707; H01R 13/40; H01R 13/46; H01R 13/2464
USPC .......................... 439/66, 68, 70, 74, 79, 82
See application file for complete search history.

(56) References Cited

U.S. PATENT DOCUMENTS

| 4,548,451 A | * 10/1985 | Benarr | ................. H01R 12/714 29/848 |
|---|---|---|---|
| 5,163,834 A | * 11/1992 | Chapin | .............. H01R 13/2435 439/591 |
| 5,427,535 A | * 6/1995 | Sinclair | .............. H01R 13/2414 439/66 |

(Continued)

FOREIGN PATENT DOCUMENTS

| CN | 2833958 Y | 11/2006 |
|---|---|---|
| CN | 2838103 Y | 11/2006 |

(Continued)

*Primary Examiner* — Harshad C Patel
(74) *Attorney, Agent, or Firm* — Locke Lord LLP

(57) ABSTRACT

An electrical connector for electrically connecting a chip module to a circuit board includes an insulating body, and a plurality of terminals. Each of the terminals has a base accommodated in the insulating body and a mating portion contacting a conductive sheet of the chip module. A plurality of supporting portions extend upward from an upper surface of the insulating body, and an upper end of each of the supporting portions is provided with a crumple portion located below the mating portion of one of the terminals. The chip module is mounted on the electrical connector, the conductive sheet presses the mating portion, the mating portion abuts the crumple portion, and the crumple portion is pressed so that a height of the crumple portion is decreased.

19 Claims, 7 Drawing Sheets

(56) References Cited

U.S. PATENT DOCUMENTS

| | | | |
|---|---|---|---|
| 6,312,266 B1 * | 11/2001 | Fan | H01R 12/7005 439/91 |
| 6,663,399 B2 * | 12/2003 | Ali | H05K 3/3436 439/228 |
| 6,949,143 B1 * | 9/2005 | Kurita | B65G 49/068 118/719 |
| 7,008,237 B1 | 3/2006 | Ma et al. | |
| 7,070,420 B1 * | 7/2006 | Wakefield | H01R 13/2414 439/66 |
| 7,189,080 B2 * | 3/2007 | Tang | H01R 13/2435 439/66 |
| 7,448,877 B1 * | 11/2008 | Pennypacker | H01R 13/2435 439/66 |
| 7,549,870 B2 * | 6/2009 | Mason | H01R 9/096 439/66 |
| 7,549,871 B2 * | 6/2009 | Pennypacker | H01R 13/2407 439/66 |
| 7,585,173 B2 * | 9/2009 | Hilty | H01R 13/2414 439/66 |
| 7,887,336 B2 * | 2/2011 | Nikaido | H01L 23/49827 439/66 |
| 8,109,768 B2 * | 2/2012 | Nikaido | H01R 12/57 174/262 |
| 8,956,193 B2 * | 2/2015 | Tran | H05K 7/1069 439/66 |
| 2006/0040518 A1 * | 2/2006 | Ma | H01R 13/2442 439/66 |

FOREIGN PATENT DOCUMENTS

| | | |
|---|---|---|
| CN | 101394032 A | 3/2009 |
| CN | 203445353 U | 2/2014 |
| CN | 203690613 U | 7/2014 |
| CN | 107317132 A | 11/2017 |

* cited by examiner ved the contents  of the above

ELECTRICAL CONNECTOR HAVING SUPPORTING PORTIONS AND INSULATING BODY INTEGRALLY FORMED

CROSS-REFERENCE TO RELATED PATENT APPLICATION

This non-provisional application claims priority to and the benefit of, under 35 U.S.C. § 119(a), patent application Serial No. CN201711250191.7 filed in China on Dec. 1, 2017 and patent application Serial No. CN201711419161.4 filed in China on Dec. 25, 2017. The disclosures of the above applications are incorporated herein in their entireties by reference.

Some references, which may include patents, patent applications and various publications, are cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference were individually incorporated by reference.

FIELD

The present invention relates to an electrical connector, and more particularly to an electrical connector that enhances the contact effect of a terminal and a conductive sheet of a chip module.

BACKGROUND

The background description provided herein is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

An existing electrical connector includes an insulating body and multiple terminals disposed in an insulating body. Multiple positioning members are disposed on an upper surface of the insulating body to sustain the terminals. A chip module is mounted on the electrical connector. The terminal are clamped between the chip module and the positioning members to enhance the contact force of the terminals and the chip module. However, to mount the positioning members on the insulating body that has been formed is complicated with high cost. Meanwhile, the chip module is mounted to the insulating body, and the insulating body is pressed and depressed at its middle portion, while the two sides are warped, and the heights of the positioning members will vary, which results in that the positioning members at a lower height cannot support the terminals, leading to hanging of terminals, so that the contact force between the terminals and the chip module is reduced, and the contact resistance is increased. Meanwhile, in the process of transmitting high frequency signals, the hanging terminals will generate resonance phenomenon, thus affecting the transmission quality of high frequency signals.

Therefore, a heretofore unaddressed need to design a novel electrical connector exists in the art to address the aforementioned deficiencies and inadequacies.

SUMMARY

In view of the above deficiencies in the background, the present invention is directed to an electrical connector in which the supporting portions and the insulating body are integrally formed, and the supporting portions provide a good supporting effect on the terminals.

To achieve the foregoing objective, the invention adopts the following technical solutions:

An electrical connector configured to electrically connect a chip module to a circuit board includes: an insulating body; and a plurality of terminals, each of the terminals having a base accommodated in the insulating body and a mating portion contacting a conductive sheet of the chip module; wherein a plurality of supporting portions extend upward from an upper surface of the insulating body, an upper end of each of the supporting portions is provided with a crumple portion located below the mating portion of one of the terminals, the chip module is mounted on the electrical connector, the conductive sheet presses the mating portion, the mating portion abuts the crumple portion, and the crumple portion is pressed so that a height of the crumple portion is decreased.

In certain embodiments, the conductive sheet abuts the mating portion to form a first contact portion, the mating portion abuts the crumple portion to form a second contact portion, and the second contact portion is located right below the first contact portion.

In certain embodiments, the supporting portion is located in front of the base, the mating portion extends toward the supporting portion, and before the conductive sheet presses the mating portion, the mating portion is entirely located behind the supporting portion.

In certain embodiments, the mating portion has an opening vertically running therethrough, and when the mating portion abuts the crumple portion, the crumple portion is exposed upward through the opening.

In certain embodiments, the crumple portion is tapered from bottom to top before the mating portion abuts the crumple portion.

In certain embodiments, the mating portion has a bottom surface formed in a curved surface, and the crumple portion abuts an apex point of the bottom surface.

In certain embodiments, a deformation amount of the crumple portion is greater than or equal to 0.002 mm.

In certain embodiments, the deformation amount of the crumple portion is less than or equal to 0.15 mm.

In certain embodiments, the upper surface of the insulating body has a sustaining portion extending upward to sustain the chip module.

In certain embodiments, a top of the sustaining portion is higher than a top of each of the supporting portions.

In certain embodiments, the sustaining portion is provided between the adjacent terminals.

In certain embodiments, an elastic arm is connected to the base and the mating portion, and a position limiting portion extends upward from the upper surface of the insulating body and is located below the elastic arm to limit the elastic arm.

In certain embodiments, the conductive sheet presses the mating portion, and the elastic arm abuts the position limiting portion.

In certain embodiments, a top of the position limiting portion is lower than a top of each of the supporting portions.

In certain embodiments, a strip connecting portion extends upward from the base, the strip connecting portion extends out of the upper surface of the insulating body, and a top of the strip connecting portion is lower than a top of each of the supporting portions.

In certain embodiments, after the chip module is mounted on the electrical connector, a middle portion of the insulating body is depressed by pressing.

In certain embodiments, the supporting portions comprise at least one first supporting portion provided near an edge portion of the insulating body, and at least one second supporting portion provided near the middle portion of the insulating body, an upper end of the at least one first supporting portion is provided with a first crumple portion, and an upper end of the at least one second supporting portion is provided with a second crumple portion.

In certain embodiments, a crumple amount of the first crumple portion is greater than a crumple amount of the second crumple portion.

In certain embodiments, when the chip module is dismounted, a top end of the first crumple portion and a top end of the second crumple portion are located on a same horizontal plane.

In certain embodiments, a ratio of a sum of quantities of the at least one first supporting portion and the at least one second supporting portion to a total quantity of the supporting portions is greater than 50% and less than 100%.

Compared with the related art, certain embodiments of the present invention has the following beneficial effects:

In the electrical connector, a crumple portion is provided at an upper end of each supporting portion. When the conductive sheets of the chip module press the terminals, the mating portion abuts the corresponding crumple portion, and the crumple portion is pressed and crumpled, so that the supporting portions can support the mating portions of the corresponding terminals, thereby ensuring that the electrical connector can withstand greater compressive stress, and more terminals tightly contact the chip modules to improve the high-frequency signal transmission performance of the electrical connector.

These and other aspects of the present invention will become apparent from the following description of the preferred embodiment taken in conjunction with the following drawings, although variations and modifications therein may be effected without departing from the spirit and scope of the novel concepts of the disclosure.

BRIEF DESCRIPTION OF THE DRAWINGS

The accompanying drawings illustrate one or more embodiments of the disclosure and together with the written description, serve to explain the principles of the disclosure. Wherever possible, the same reference numbers are used throughout the drawings to refer to the same or like elements of an embodiment, and wherein.

DETAILED DESCRIPTION

Figure 1:
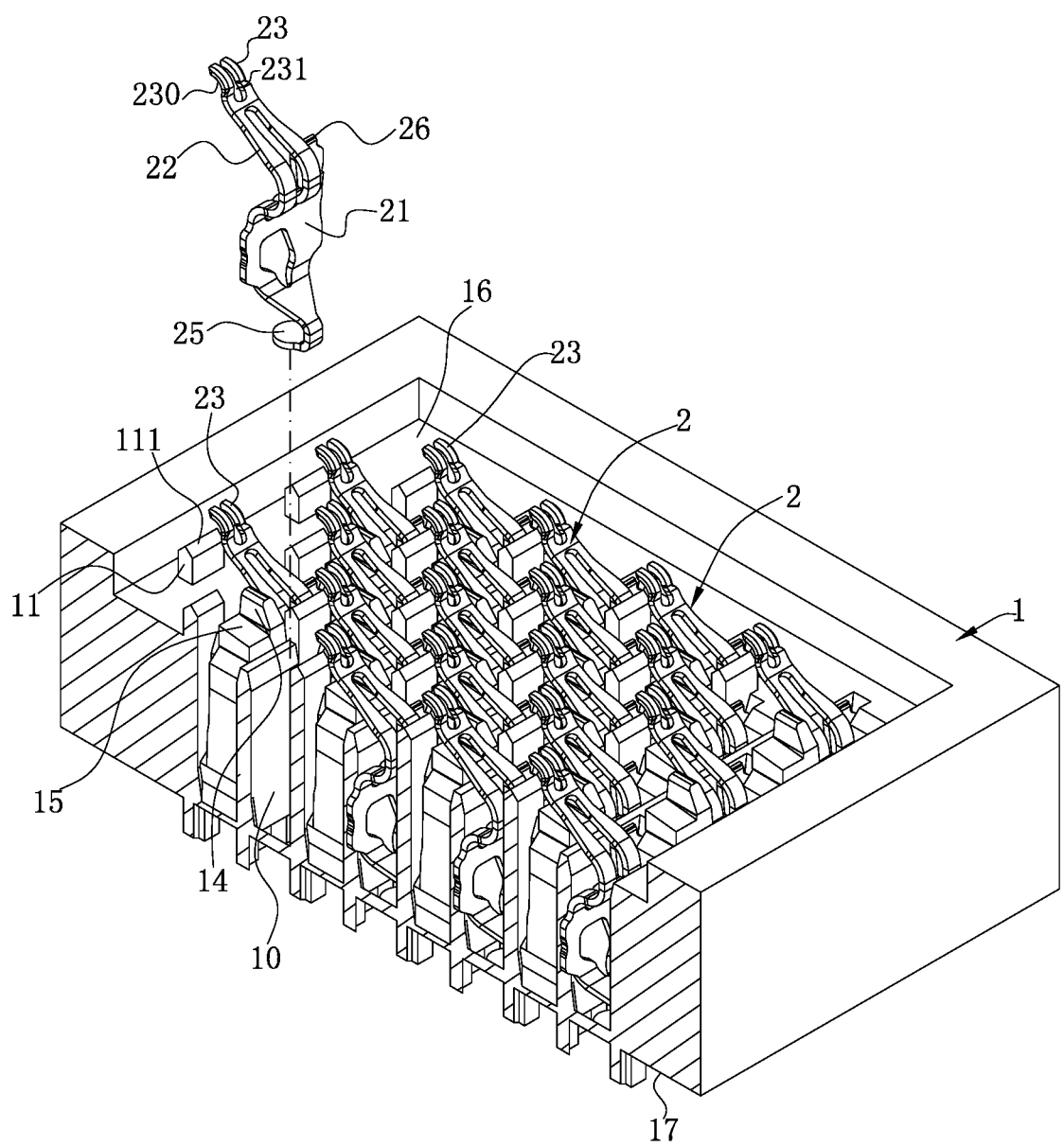
FIG. 1 is a partial sectional view of an electrical connector according to certain embodiments of the present invention.

The present invention is more particularly described in the following examples that are intended as illustrative only since numerous modifications and variations therein will be apparent to those skilled in the art. Various embodiments of the invention are now described in detail. Referring to the drawings, like numbers indicate like components throughout the views. As used in the description herein and throughout the claims that follow, the meaning of "a", "an", and "the" includes plural reference unless the context clearly dictates otherwise. Also, as used in the description herein and throughout the claims that follow, the meaning of "in" includes "in" and "on" unless the context clearly dictates otherwise. Moreover, titles or subtitles may be used in the specification for the convenience of a reader, which shall have no influence on the scope of the present invention.

It will be understood that when an element is referred to as being "on" another element, it can be directly on the other element or intervening elements may be present therebetween. In contrast, when an element is referred to as being "directly on" another element, there are no intervening elements present. As used herein, the term "and/or" includes any and all combinations of one or more of the associated listed items.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower", can therefore, encompasses both an orientation of "lower" and "upper," depending of the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

As used herein, "around", "about" or "approximately" shall generally mean within 20 percent, preferably within 10 percent, and more preferably within 5 percent of a given value or range. Numerical quantities given herein are approximate, meaning that the term "around", "about" or "approximately" can be inferred if not expressly stated.

As used herein, the terms "comprising", "including", "carrying", "having", "containing", "involving", and the like are to be understood to be open-ended, i.e., to mean including but not limited to.

The description will be made as to the embodiments of the present invention in conjunction with the accompanying drawings in FIGS. 1-7. In accordance with the purposes of this invention, as embodied and broadly described herein, this invention, in one aspect, relates to an electrical connector.

Figure 4:
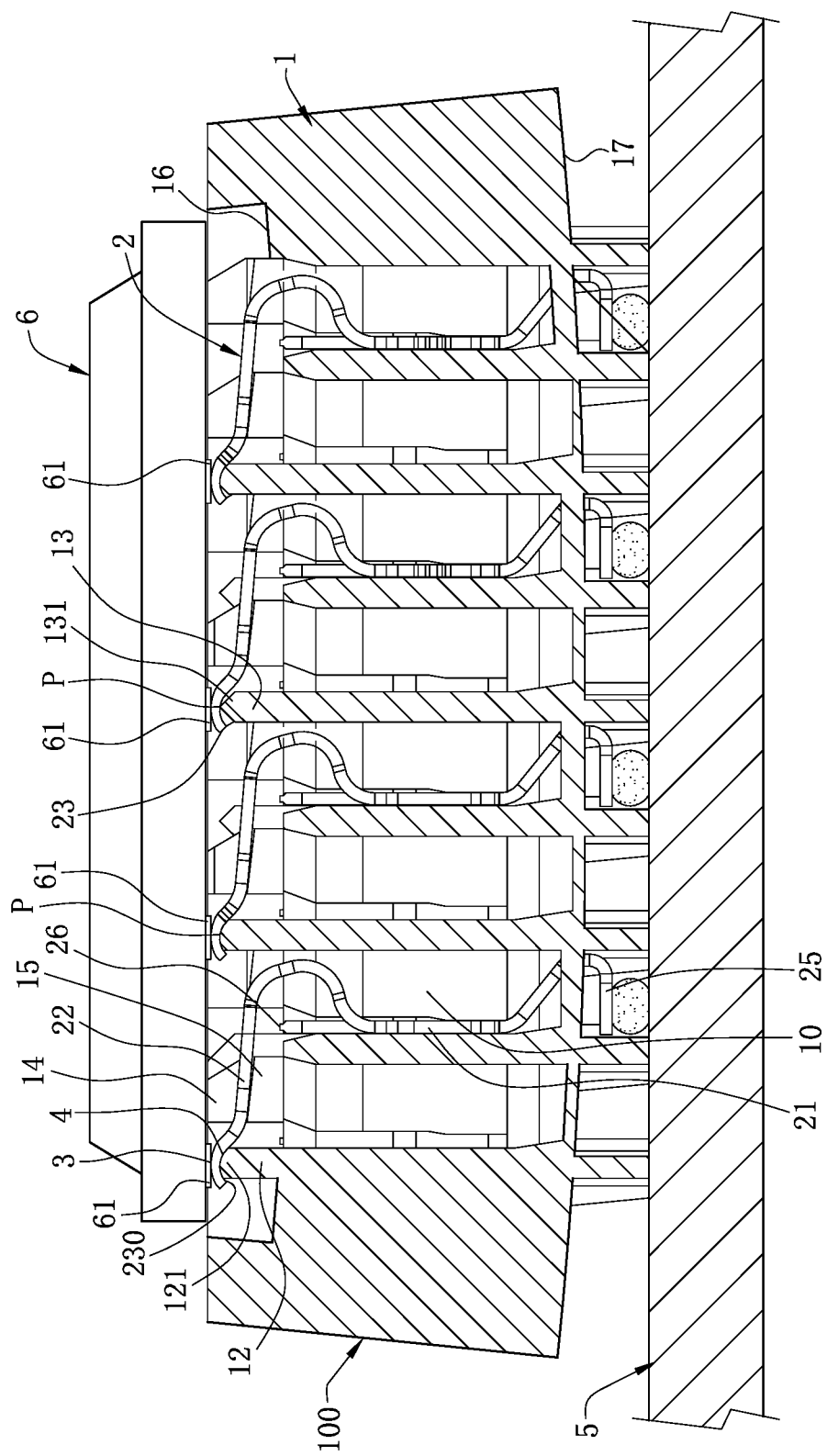
FIG. 4 is a side sectional view of an electrical connector after mounting of a chip module according to certain embodiments of the present invention.

FIG. 1 and FIG. 4 show an electrical connector 100 according to certain embodiments of the present invention, which is used to electrically connect a chip module 6 to a circuit board 5. The major components of the electrical connector 100 includes: an insulating body 1, a plurality of terminals 2 accommodated in the insulating body 1, and a plurality of supporting portions 11 provided in the insulating body 1 for supporting the terminals 2.

As shown in FIG. 1, the insulating body 1 has an upper surface 16 and a lower surface 17 opposite to each other. Multiple terminal holes 10 are disposed on the insulating body 1 and vertically run through the upper surface 16 and the lower surface 17, and the terminal holes 10 are disposed in a number of rows parallel in the front and back, and the terminal holes 10 of each row are interlaced with the terminal holes 10 of the adjacent row.

Figure 2:
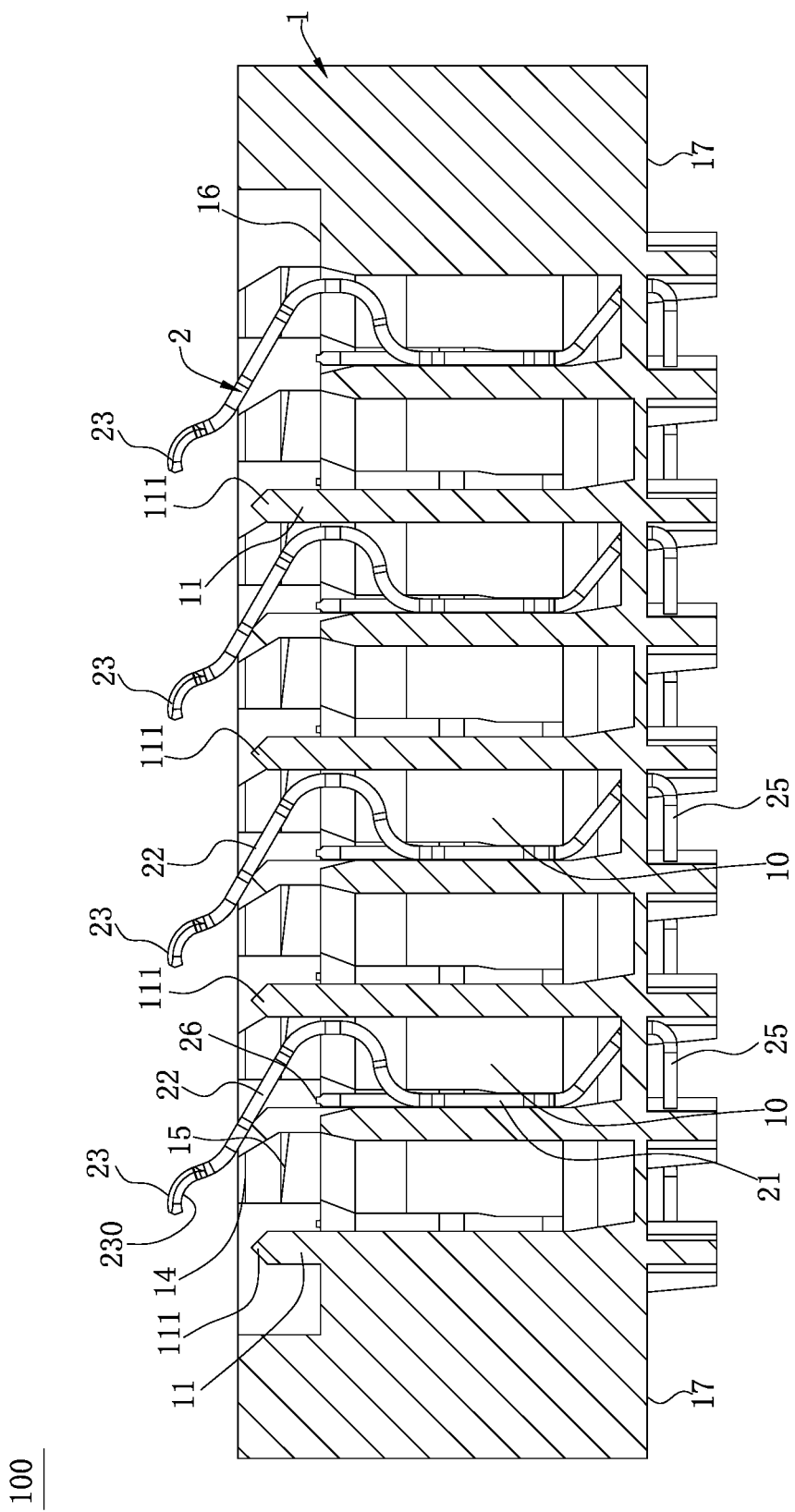
FIG. 2 is a side view of FIG. 1.
Figure 7:
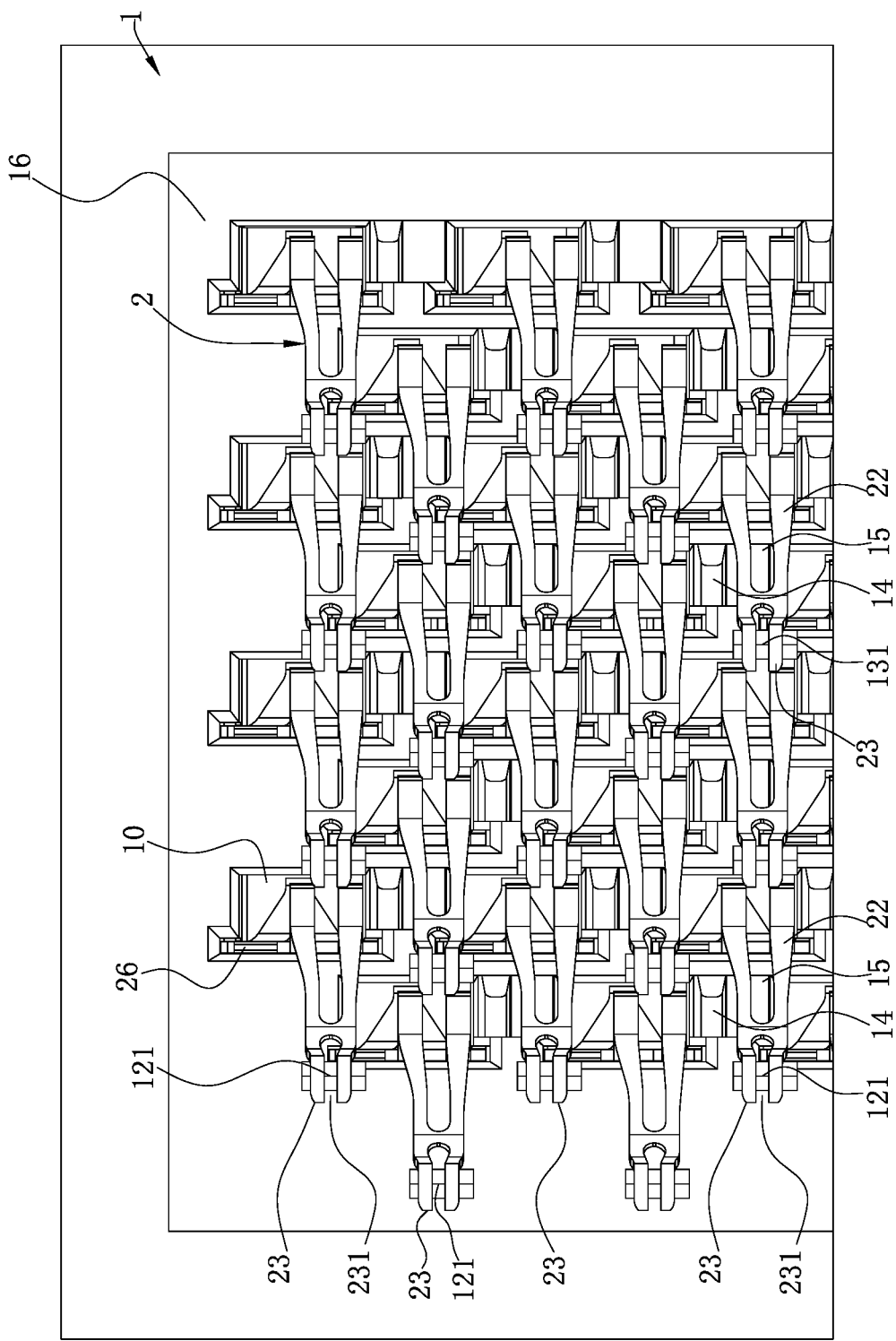
FIG. 7 is a top view of FIG. 4 after the chip module and circuit board are hidden.

As shown in FIG. 1, FIG. 2 and FIG. 7, in a same row of terminal holes 10, a sustaining portion 14 and a position limiting portion 15 are provided between two adjacent terminal holes 10 to be connected left and right and protrude from the upper surface 16, each position limiting portion 15 is located right front one of the holes 10 in a back row. The sustaining portion 14 sustains the chip module 6 and isolates the two adjacent terminal holes 10, and the sustaining portion 14 is located higher than the position limiting portion 15. A supporting portion 11 is provided right in front of the position limiting portion 15 and right in front of the terminal hole 10, and the supporting portion 11 is located higher than the position limiting portion 15 and lower than the sustaining portion 14.

A bottom of the supporting portion 11 is in a cuboid shape, and a crumple portion 111 is provided at a top thereof. The crumple portion 111 is tapered to form a horizontal straight line from bottom to top. In other embodiments, the crumple portion 111 may be tapered from bottom to top to form an arc. It is also reasonable to provide the crumple portion 111 to have a small platform at its top, and the area of the small platform is significantly smaller than a cross-sectional area of the bottom end of the crumple portion 111. Moreover, the crumple portion 111 may be provided to be in a pinnacle shape.

In this embodiment, each of the terminal holes 10 corresponds to one of the supporting portions 11 for supporting the terminals 2 to achieve a good supporting effect. In other embodiments, some of the terminal holes 10 are not provided with corresponding supporting portions 11. Similarly, the quantity of the sustaining portions 14 may be more than or less than or equal to the quantity of the terminal holes 10, and the quantity of the position limiting portions 15 may be more than or less than or equal to the quantity of the terminal holes 10.

As shown in FIG. 1 and FIG. 2, each of the terminals 2 has a base 21. An elastic arm 22 is extended obliquely upward and forward from one side of an upper end of the base 21. A mating portion 23 is extended forward from the elastic arm 22. A bottom surface 230 of the mating portion 23 is formed in a curved surface, and an opening 231 is provided at the center thereof and runs vertically therethrough. The opening 231 runs forward through a front end of the mating portion 23, such that the mating portion 23 is formed in a "fork" shape. A strip connecting portion 26 is extended from the other side of the upper end of the base 21, and the strip connecting portion 26 is configured to be connected to a strip. The strip connecting portion 26 is located lower than the supporting portion 11. A soldering portion 25 is extended downward from the base 21.

Referring again to FIG. 1 and FIG. 2, each terminal 2 is accommodated in the corresponding terminal hole 10, and both sides of the base 21 are fastened to the terminal hole 10. The elastic arm 22 extends from the base 21 to be above the corresponding position limiting portion 15 and adjacent to the corresponding sustaining portion 14. The mating portion 23 is located above the corresponding supporting portion 11, and the mating portion 23 is entirely located behind the corresponding supporting portion 11.

Figure 3:
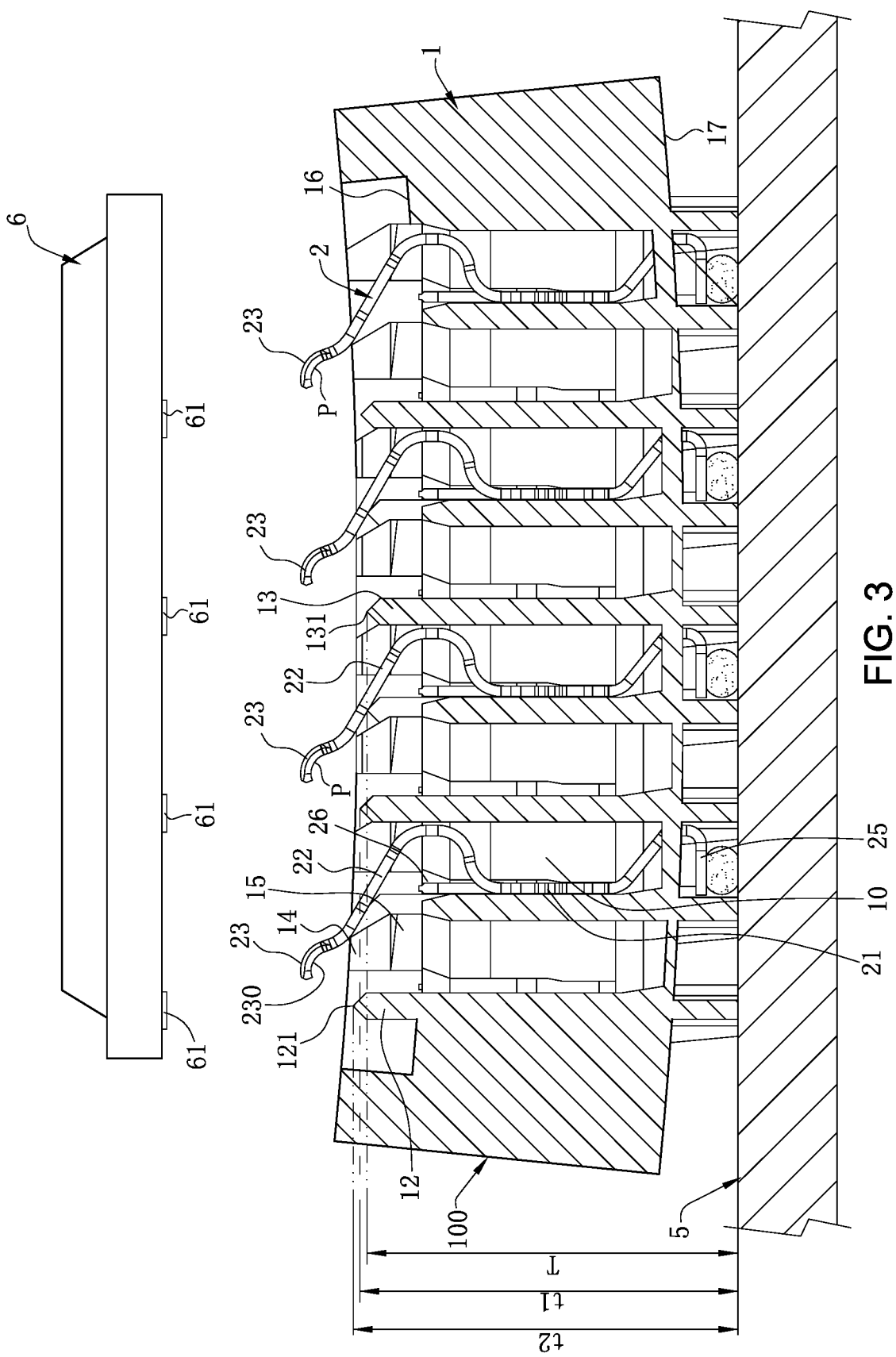
FIG. 3 is a side sectional view of an electrical connector after being soldered on a circuit board and before mounting of a chip module according to certain embodiments of the present invention.

As shown in FIG. 2 and FIG. 3, the electrical connector 100 is soldered to the circuit board 5 by reflow soldering, and the soldering portion 25 is soldered to the circuit board 5. Due to thermal expansion, the insulating body 1 is warped, such that the supporting portions 11 which are of same height originally may become of uneven heights after the electrical connector 100 is soldered to the circuit board 5, and the supporting portion 11 disposed near an outer edge of the insulating body 1 and the crumple portion 111 at the top thereof are raised relative to the circuit board 5. In this case, a distance between the top of each crumple portion 111 and the circuit board may be t1 or t2, and the supporting portion 11 of this part and the crumple portion 111 on the top thereof are respectively defined as a first supporting portion 12 and a first crumple portion 121. On the other hand, the supporting portion 11 near the middle portion of the insulating body 1 and the crumple portion 111 at the top thereof remain the same height relative to the circuit board 5, and a distance between the top of the crumple portion 111 and the circuit board 5 is T. The supporting portion 11 of this part and the crumple portion 111 on the top thereof are defined as a second supporting portion 13 and a second crumple portion 131 respectively.

As shown in FIG. 3 and FIG. 4, the chip module 6 is mounted on the electrical connector 100. A conductive sheet 61 of the chip module 6 presses a mating portion 23, and the two components move downward simultaneously, so that an apex point P of the bottom surface 230 of the mating portion 23 abuts the first crumple portion 121. Further referring to FIG. 7, the first crumple portion 121 is exposed upward through the opening 231, and the first crumple portion 121 may even be partially squeezed into the opening 231, so that the opening 231 can increase the contact force between the mating portion 23 and the first crumple portion 121. Because the chip module 6 provides a greater pressure, the first crumple portion 121 is pressed and crumpled with a crumple amount being in a range from 0.002 mm to 0.15 mm.

Another conductive sheet 61 presses the other mating portion 23, and the mating portion 23 abuts the second crumple portion 131. When the first crumple portion 121 crumples to the same height as the second crumple portion 131, the chip module 6 can stop pressing.

When the mounting of the chip module 6 is completed, the first crumple portion 121 on the top of the first supporting portion 12 is pressed downward and crumpled to generate a crumple amount, which is greater than a crumple amount of the second crumple portion 131 at the top of the second supporting portion 13.

As shown in FIG. 4, when the foregoing movement ends, the first crumple portion 121 stops crumpling. The conductive sheet 61 abuts the mating portion 23 to form a first contact portion 3, and the mating portion 23 abuts the first crumple portion 121 to form a second contact portion 4. The first contact portion 3 is located right above the second contact portion 4 so that they will not produce a shear stress to the mating portion 23 due to a front-rear dislocation. Meanwhile, the pressure provided by the chip module 6 may be vertically conducted downward to the supporting portion 11, increasing the contact force between the conductive sheet 61 and the mating portion 23.

During the downward pressing process of the chip module 6, the mating portion 23 moves forward relative to the conductive sheet 61 in a straight-forward manner, and they scrap against each other to remove impurities such as oxides or dust at the contact positions thereof.

Figure 5:
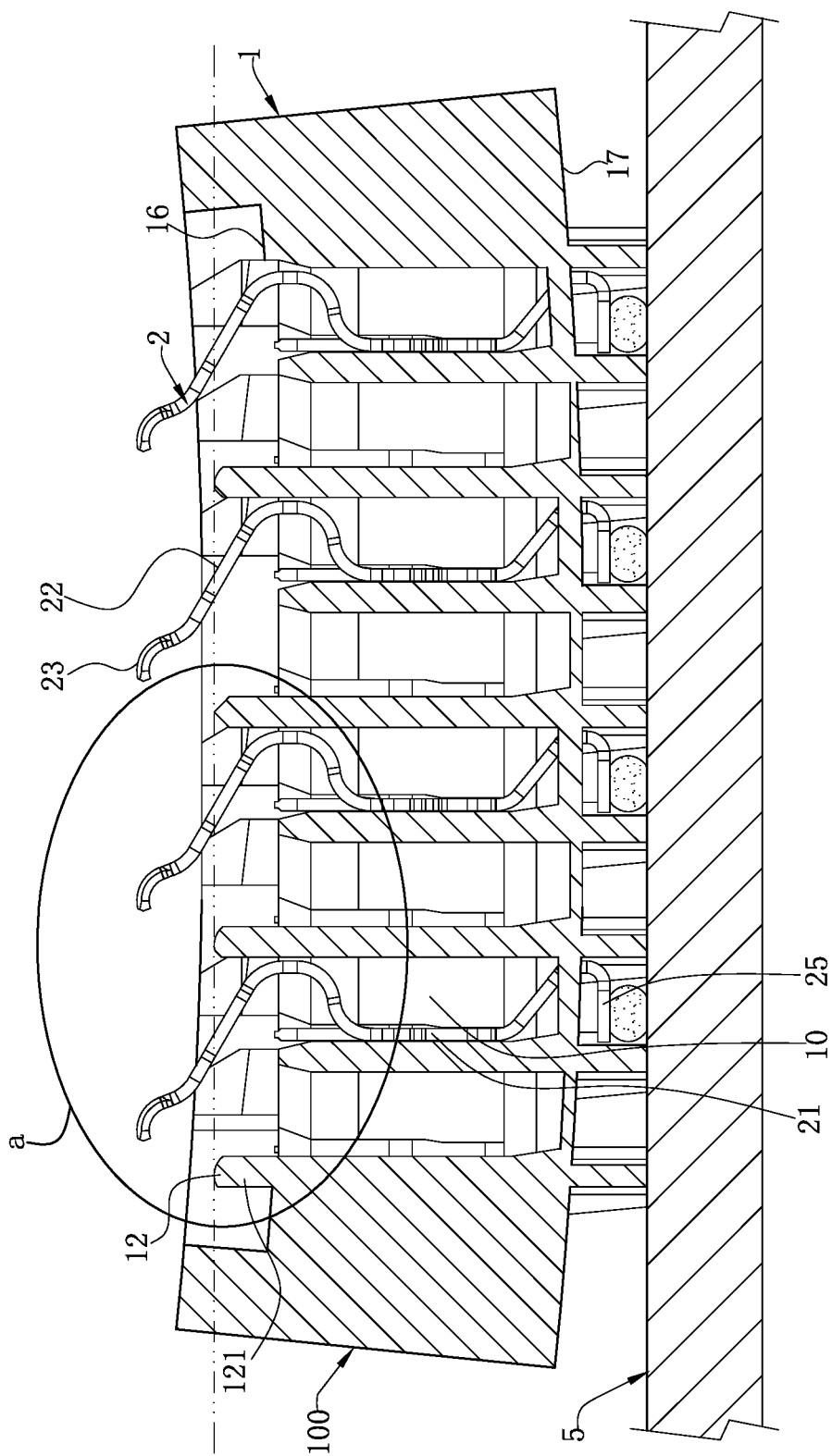
FIG. 5 is a side sectional view of FIG. 4 after removing the chip module.
Figure 6:
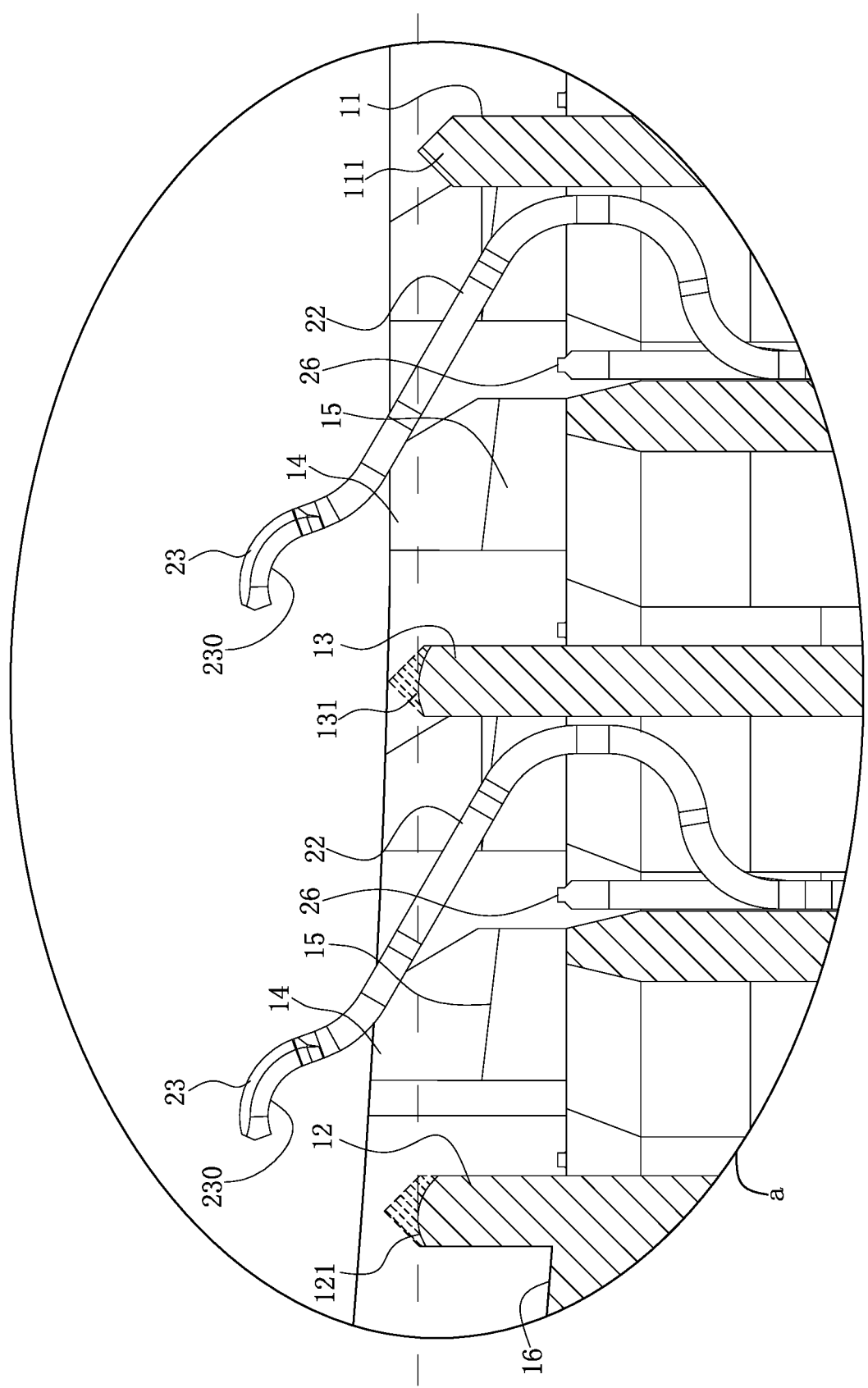
FIG. 6 is an enlarged view of a part a of FIG. 5.

As shown in FIG. 4, FIG. 5 and FIG. 6, after the chip module 6 is removed, since the first crumple portion 121 and the second crumple portion 131 are formed integrally with the insulating body 1, the crumple is irreversible, so that rebound is avoided after pressing and crumpling, and the top of the first crumple portion 121 and the top of the second crumple portion 131 are still at the same level. In other embodiments, the first crumple portion 121 and the insulating body 1 are provided separately, and the first crumple portion 121 may be made of an elastic material and disposed on the top of the first supporting portion 12, but the process may be more complicated and the cost may be higher.

In other embodiments, when the electrical connector 100 is soldered to the circuit board 5, the insulating body 1 may warp in other forms. When the first crumple portion 121 is crumpled to the same height as the second crumple portion 131, the chip module 6 can be pressed downward until the bottom surface thereof abuts the corresponding sustaining portion 14, and the elastic arm 22 abuts the position limiting portion 15 to avoid excessive bending of the elastic arm 22. In the process, the first crumple portion 121 and the second crumple portion 131 are crumpled simultaneously. In other embodiments, the chip module 6 presses the middle portion of the electrical connector 100, resulting in the depression of the middle portion and warpage of the edge portion of the insulating body 1. The arrangement of the first crumple portion 121 and the second crumple portion 131 ensures that a plurality of the conductive sheets 61 are correspondingly in close contact with a plurality of the mating portions 23.

It should also be noted that, based on the existing material properties and technological level, among all of the supporting portions 11 being provided, in addition to the support for the mating portions 23 of the corresponding terminals 2 formed by the first supporting portion 12 and the second supporting portion 13, there might be some supporting portions 11 not supporting the mating portions 23 of the corresponding terminals 2. A ratio of a sum of quantities of the first supporting portions 12 and the second supporting portions 13 to a total quantity of the supporting portions 11 is greater than 50% but less than 100%, and the ratio will be closer to 100% with the improvement of material properties and industrial levels.

To sum up, the electrical connector according to certain embodiments of the present invention has the following beneficial effects:

1. A plurality of supporting portions 11 extend upward from an upper surface 16 of the insulating body 1 to support the mating portions 23 of the terminals 2, and the supporting portions 11 are integrally formed with the insulating body 1 to simplify the manufacturing process. An upper end of each supporting portion 11 is provided with a crumple portion 111. When the conductive sheets 61 of the chip module 6 press the terminals 2, the mating portion 23 abuts the corresponding crumple portion 111, and the crumple portion 111 is pressed and crumpled, so that the supporting portions 11 can support the mating portions 23 of the corresponding terminals 2 to ensure that the electrical connector 100 can withstand greater compressive stress, and more terminals 2 tightly contact the chip modules 6 to improve the high-frequency signal transmission performance of the electrical connector 100.

2. The mating portion 23 extends forward relative to the base 21 in a direction toward the supporting portion 11. When the conductive sheets 61 of the chip module 6 press the mating portion 23, the conductive sheets 61 move straight downward, and the mating portion 23 is moved forward relative to the corresponding conductive sheet 61 and they scrap each other. Before the conductive sheet 61 presses the mating portion 23, the mating portion 23 is located entirely behind the supporting portion 11. Thereafter, the mating portion 23 abuts the supporting portion 11, so as to extend a distance of the forward movement of the mating portion 23, and enhance the scraping effect between the mating portion 23 and the conductive sheet 61, to effectively remove impurities such as oxides and dust therebetween.

3. The top of the strip connecting portion 26 is lower than the top of the supporting portion 11 to prevent the short-circuiting of the strip connecting portion 26 and other terminals 2, and prevent the short-circuiting of the strip connecting portion 26 and the conductive sheet 61 to affect the electrical performance of the electrical connector 100.

The foregoing description of the exemplary embodiments of the invention has been presented only for the purposes of illustration and description and is not intended to be exhaustive or to limit the invention to the precise forms disclosed. Many modifications and variations are possible in light of the above teaching.

The embodiments were chosen and described in order to explain the principles of the invention and their practical application so as to activate others skilled in the art to utilize the invention and various embodiments and with various modifications as are suited to the particular use contemplated. Alternative embodiments will become apparent to those skilled in the art to which the present invention pertains without departing from its spirit and scope. Accordingly, the scope of the present invention is defined by the appended claims rather than the foregoing description and the exemplary embodiments described therein.

What is claimed is:

1. An electrical connector configured to electrically connect a chip module to a circuit board, comprising:
   an insulating body; and
   a plurality of terminals, each of the terminals having a base accommodated in the insulating body and a mating portion contacting a conductive sheet of the chip module;
   wherein a plurality of supporting portions extend upward from an upper surface of the insulating body, an upper end of each of the supporting portions is provided with a crumple portion located below the mating portion of one of the terminals, the chip module is mounted on the electrical connector, the conductive sheet presses the mating portion, the mating portion abuts the crumple portion, and the crumple portion is pressed so that a height of the crumple portion is decreased; and
   wherein a strip connecting portion extends upward from the base, the strip connecting portion extends out of the upper surface of the insulating body, and a top of the strip connecting portion is lower than a top of each of the supporting portions.

2. The electrical connector according to claim 1, wherein the conductive sheet abuts the mating portion to form a first contact portion, the mating portion abuts the crumple portion to form a second contact portion, and the second contact portion is located right below the first contact portion.

3. The electrical connector according to claim 1, wherein the supporting portion is located in front of the base, the mating portion extends toward the supporting portion, and before the conductive sheet presses the mating portion, the mating portion is entirely located behind the supporting portion.

4. The electrical connector according to claim 1, wherein the mating portion has an opening vertically running therethrough, and when the mating portion abuts the crumple portion, the crumple portion is exposed upward through the opening.

5. The electrical connector according to claim 1, wherein the crumple portion is tapered from bottom to top, so that a straight line is formed at its top before the mating portion abuts the crumple portion.

6. The electrical connector according to claim 1, wherein the mating portion has a bottom surface formed in a curved surface, and the crumple portion abuts an apex point of the bottom surface.

7. The electrical connector according to claim 1, wherein a deformation amount of the crumple portion is greater than or equal to 0.002 mm.

8. The electrical connector according to claim 7, wherein the deformation amount of the crumple portion is less than or equal to 0.15 mm.

9. The electrical connector according to claim 1, wherein the upper surface of the insulating body has a sustaining portion extending upward to sustain the chip module.

10. The electrical connector according to claim 9, wherein a top of the sustaining portion is higher than a top of each of the supporting portions.

11. The electrical connector according to claim 9, wherein the sustaining portion is provided between the adjacent terminals.

12. The electrical connector according to claim 1, wherein an elastic arm is connected to the base and the mating portion, and a position limiting portion extends upward from the upper surface of the insulating body and is located below the elastic arm to limit the elastic arm.

13. The electrical connector according to claim 12, wherein the conductive sheet presses the mating portion, and the elastic arm abuts the position limiting portion.

14. The electrical connector according to claim 12, wherein a top of the position limiting portion is lower than a top of each of the supporting portions.

15. The electrical connector according to claim 1, wherein after the chip module is mounted on the electrical connector, a middle portion of the insulating body is depressed by pressing.

16. The electrical connector according to claim 15, wherein the supporting portions comprise at least one first supporting portion provided near an edge portion of the insulating body, and at least one second supporting portion provided near the middle portion of the insulating body, an upper end of the at least one first supporting portion is provided with a first crumple portion, and an upper end of the at least one second supporting portion is provided with a second crumple portion.

17. The electrical connector according to claim 16, wherein a crumple amount of the first crumple portion is greater than a crumple amount of the second crumple portion.

18. The electrical connector according to claim 16, wherein when the chip module is dismounted, a top end of the first crumple portion and a top end of the second crumple portion are located on a same horizontal plane.

19. The electrical connector according to claim 16, wherein a ratio of a sum of quantities of the at least one first supporting portion and the at least one second supporting portion to a total quantity of the supporting portions is greater than 50% and less than 100%.

* * * * *